United States Patent [19]

Nishizawa et al.

[11] Patent Number: 5,426,314
[45] Date of Patent: Jun. 20, 1995

[54] INSULATED GATE CONTROL STATIC INDUCTION THYRISTOR

[75] Inventors: Jun-ichi Nishizawa; Sohbe Suzuki, both of Sendai, Japan

[73] Assignee: Zaidan Hojin Handotai Kenkyu Shinkokai, Miyagi, Japan

[21] Appl. No.: 232,422

[22] Filed: Apr. 21, 1994

Related U.S. Application Data

[63] Continuation of Ser. No. 921,212, Jul. 29, 1992, abandoned.

[51] Int. Cl.[6] .................... H01L 29/74; H01L 29/747
[52] U.S. Cl. .................... 257/136; 257/120; 257/124; 257/125; 257/130; 257/131; 257/135; 257/143; 257/144; 257/152; 257/273; 257/283
[58] Field of Search ............... 257/128, 130, 131, 132, 257/133, 134, 135, 136, 137, 138, 141, 142, 143, 144, 145, 146, 115, 117, 118, 119, 120, 121, 122, 123, 124, 126, 127, 147, 148, 149, 152, 153, 157, 158, 159, 160, 161, 162, 256, 259, 260, 261, 262, 263, 264, 268, 269, 270, 272, 273, 282, 283, 290, 291

[56] References Cited

U.S. PATENT DOCUMENTS

| | | | |
|---|---|---|---|
| 4,717,940 | 1/1988 | Shinohe et al. | 257/152 |
| 4,816,892 | 3/1989 | Temple | 257/149 |
| 4,914,496 | 4/1990 | Nakagawa et al. | 257/157 |
| 4,935,798 | 6/1990 | Nishizawa et al. | 257/130 |
| 4,963,972 | 10/1990 | Shinohe et al. | 257/124 |
| 4,969,027 | 11/1990 | Baliga et al. | 257/130 |
| 5,155,569 | 10/1992 | Terashima | 257/130 |

FOREIGN PATENT DOCUMENTS

| | | |
|---|---|---|
| 0417738 | 3/1991 | European Pat. Off. ............ 257/132 |
| 61-48790 | 10/1986 | Japan . |
| 62-20714 | 5/1987 | Japan . |
| 62-21275 | 5/1987 | Japan . |
| 62-21276 | 5/1987 | Japan . |
| 1-278119 | 11/1989 | Japan . |
| 3-292770 | 12/1991 | Japan . |

OTHER PUBLICATIONS

"SI Thyristors hold promise for long distance DC power transmission", Jun-ichi Nishizawa, PCI & Motor-Con 88 Jun. 6-8, 1988, Munich, West Germany.
Third SI Device Symposium Lecture Theses, 1989, Jun-ichi Nishizawa et al.
"A Double-Gate-Type Static-Induction Thyristor", Jun-ichi Nishizawa et al., IEEE Transactions on Electron Devices, vol. ED-34, No. 6, Jun. 1987.

Primary Examiner—Jerome Jackson
Assistant Examiner—Alice W. Tang
Attorney, Agent, or Firm—Fish & Richardson

[57] ABSTRACT

A static induction thyristor has a first semiconductor area having a high impurity concentration of a first conductivity type. A second semiconductor area having low impurity concentration is formed adjacent to the first semiconductor area. A third semiconductor area having a high impurity concentration of a second conductivity type which is the conductivity type opposite to the first conductivity type is formed on a part of a surface of the second semiconductor area so located as to form a fourth semiconductor area located within the third semiconductor area. A fifth semiconductor area having a high impurity concentration of the first conductivity type is formed on the part of the surface of the second semiconductor area in spaced relation to the forth semiconductor area. An insulating film formed to cover at least a portion of a surface of the fifth semiconductor area and a least a portion of the surface of the second semiconductor area, which is put between the forth semiconductor area and the fifth semiconductor area. An insulated-gate control electrode is formed on the insulating film. The first and third semiconductor areas serve as a first and second main electrode areas, respectively.

23 Claims, 10 Drawing Sheets

INSULATED GATE CONTROL STATIC INDUCTION THYRISTOR

This application is a continuation of U.S. application Ser. No. 07/921,212 filed Jul. 29, 1992, now abandoned.

BACKGROUND OF THE INVENTION

The present invention relates to a new structure of a static induction thyristor (hereafter referred to as an "SI thyristor"). Particularly, the invention relates to a structure of an insulated gate-controlled (MOS-Controlled) SI thyristor in which a gate drive circuit can be simplified.

An SI thyristor is a switching device of latching-up type, and driving of the SI thyristor has conventionally been executed by applying a positive trigger bias and a negative quench bias onto a gate. An example of the conventional driving circuit of an SI thyristor is illustrated in FIGS. 1a of the attached drawings.

Figure 1A:
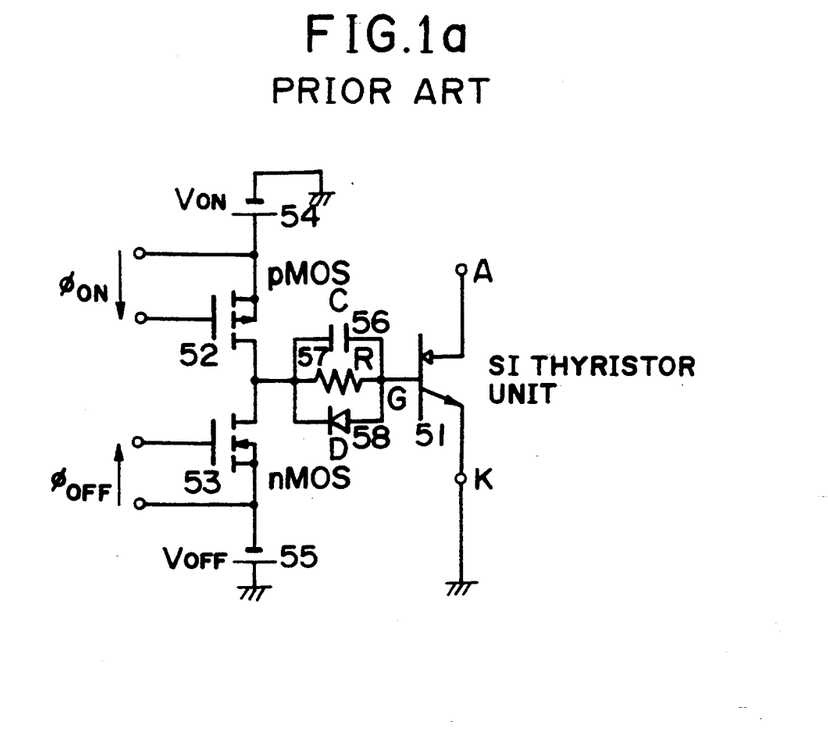
FIGS. 1a and 1b are views for explanation, showing a driving method of a conventional junction gate SI thyristor.
Figure 1B:
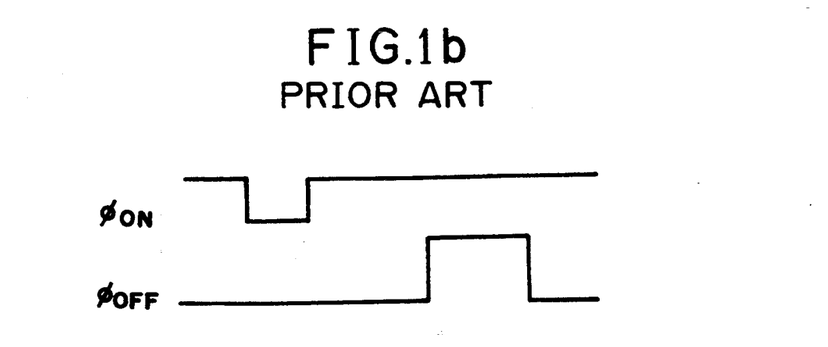

In FIG. 1a, the junction gate SI thyristor is operated by respectively inputting of a trigger pulse $\Phi_{ON}$ and a quench pulse $\Phi_{OFF}$ into a buffer circuit having a P-channel MOS transistor 52 and a positive bias power source 54, and an N-channel MOS transistor 53 and a negative bias power source 55. The trigger pulse $\Phi_{ON}$ and the quench pulse $\Phi_{OFF}$ are respectively inputted at timing illustrated in FIG. 1b. Further, a resistor 57 is inserted between the buffer circuit and a gate of the SI thyristor unit 51, for limiting the current flowing into the gate of the SI thyristor unit 51. A capacitor 56 is a speed-up condenser. A diode 58 is provided so that the current from the gate at turn-off is not limited by the resistor 57. In this approach, conventional problems include that a control circuit for generating the trigger pulses and the quench pulses are complicated in structure, and that there are many parts for the buffer. In order to solve these problems, a driving method illustrated in FIGS. 2a and 2b has been proposed in Japanese Patent Application No. SHO 63-108572 entitled "A driving method of a static induction thyristor".

Figure 2A:
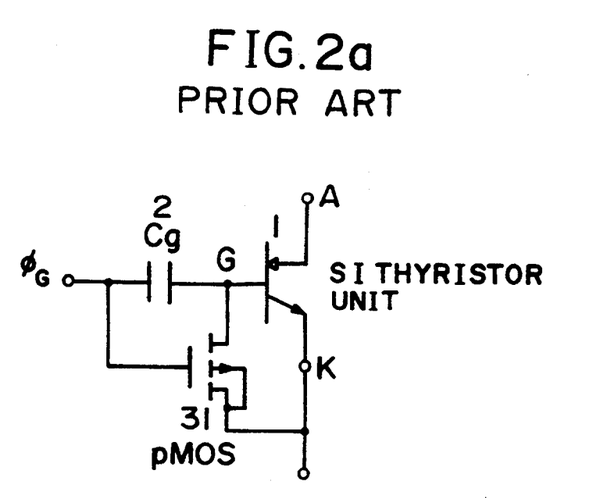
FIGS. 2a and 2b are views showing a equivalent circuit in which a PMOS is connected to a location between a ante and a cathode of a junction gate SI thyristor.

In FIG. 2a, the reference numeral 1 denotes a junction gate SI thyristor unit of the normally-off type. The SI thyristor unit has a pn junction gate to which a capacitor 2 is connected. A P-channel MOS transistor 31 is connected to a location between the gate and a cathode of the SI thyristor 1. The MOS transistor 31 has a gate which is controlled by pulse $\Phi_G$ which serve as input pulse to the capacitor 2. A waveform of the pulse $\Phi_G$ is illustrated in FIG. 2b.

Figure 2B:
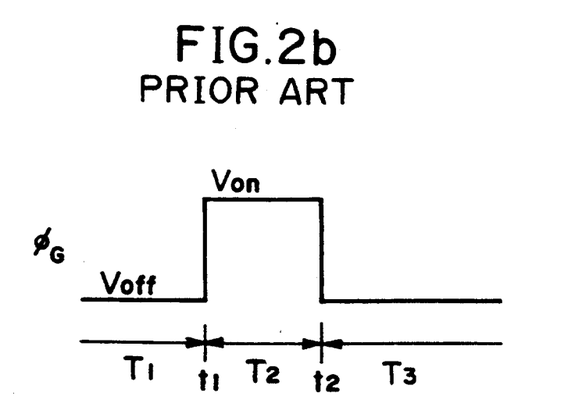

As shown in FIG. 2b, the pulses $\Phi_G$ have an electric potential of $V_{off}$ at a period of time $T_1$. By this potential, the MOS transistor 31 is brought to an "on" state or a conductive state under which there is the same potential at the gate and the cathode of the SI thyristor unit 1 so that the SI thyristor unit 1 is under a block state. When the potential of the pulse $\Phi_G$ is changed from $V_{off}$ to $V_{on}$ at time $t_1$, the potential barrier in the channel of the SI thyristor unit 1 is reduced by capacitive coupling. At this time, the MOS transistor 31 is brought to the cut-off state.

The SI thyristor unit of normally-"off" type shifts from the blocking state to the "on" state, if slight voltage is given which corresponds to a diffusion potential between the gate and the cathode. At this time, the gate current is not required except for a part required to charge the input capacitance necessary for the gate to operate, and it is not required to cause direct current to flow.

At a period of time $T_2$, the SI thyristor unit 1 is brought to an "on" state.

When the pulses $\Phi_G$ are changed from $V_{on}$ to $V_{off}$ at time $t_2$, the MOS transistor is again brought to the "on" state so that the SI thyristor unit is brought to the blocking state. However, there have been no proposals regarding a specific construction for integrating the MOS transistor, the capacitor and the SI thyristor unit illustrated in FIG. 2a, on the same chip.

Figure 3:
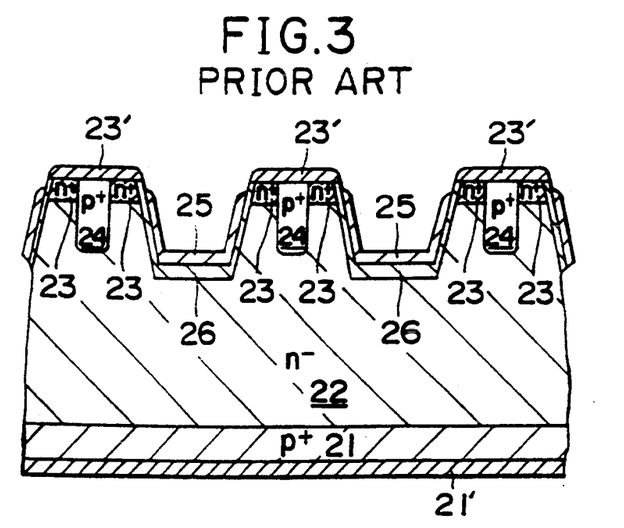
FIG. 3 is a view showing an example of an insulated gate SI thyristor.

Basically, the SI thyristor, which controls forward-direction current of a $p^+n^-n^+$ or $p^+nin^+$ diode by a control electrode, is particularly superior in operating speed, as compared with a conventional thyristor which has a $p^+npn^+$ four-layer construction. It has already been pointed out that, since conduction and interruption of the current through the SI thyristor are executed by controlling the potential barrier which occurs in the channel, a control electrode of the SI thyristor is not limited to a junction gate type, but may be a insulated gate type. This has been proposed in Japanese Patent Publication No. SHO 62-20714, Japanese Patent Publication No. SHO 62-21275, Japanese Patent Publication No. SHO 62-21276, Japanese Patent Publication No. SHO 61-48790 and the like. An example of the proposed insulated gate SI thyristor has a cross-sectional construction which is illustrated in FIG. 3. In FIG. 3, an n+ region or area 23 denotes a cathode area; a p+ area 21, an anode area; and the reference numeral 26, an insulating film. A side wall section of each of cut-into recesses has a thin portion which is brought to a gate insulating film. Positive voltage is applied to a gate electrode 25, whereby the gate insulating film forms a channel just below the gate insulating film, to remove the potential barrier on the front surface of the cathode, thereby turning on the insulated gate SI thyristor. A cathode electrode 23' is in ohmic contact with both of an n+ area 23 and a p+ area 24. Many of holes flowing from the anode flow into the p+ area 24. Turning-off of the insulated-gate SI thyristor is realized by application of negative voltage to the gate electrode 25. The p+ area 24 could be formed in not common to the cathode area, but an independent electrode could be formed. In this case the holes could be drawn from the p+ area 24 at turning-off and the insulated gate SI thyristor could be turned off at a further high speed. However, a gate drive circuit is complicated. In any case, a specific structure in which the MOS transistor is connected to the location between the gate and the cathode and the gate capacitor is connected to the gate p+ region and they are integrated on the same chip of the SI thyristor unit has not at all been disclosed in the insulated gate SI thyristor which has already been proposed.

SUMMARY OF THE INVENTION

It is an object of the invention to provide a new structure of an SI thyristor which is named as an insulated gate-controlled (MOS controlled) SI thyristor, in which a gate drive circuit and a control circuit are simplified, and the number of parts of the drive circuit can also be deleted.

It is another object of the invention to provide a new structure in which gate loss can be reduced without deteriorating a characteristic of the SI thyristor, whose forward voltage drop is essentially low, and switching speed is inherently high.

It is a still further object of the invention to provide a specific structure for integrating a MOS diode (capacitor) and a MOS transistor for driving a gate, on the same monolithic chip of an SI thyristor unit.

According to the invention, there is provided a new SI thyristor or MOS controlled SI thyristor in which a MOS diode at an upper portion of a gate region of an SI thyristor unit and an insulated-gate transistor (a MOS transistor or a MIS transistor) formed between the gate and a cathode or between the gate and an anode region of an SI thyristor unit is merged onto a single monolithic chip.

With the above structure of the invention, it is not required to use the negative and positive electric power sources respectively for trigger pulses and quench pulses, and the insulated gate-controlled SI thyristor can be gate-driven by a simple rectangular wave. Accordingly, a drive circuit can be simplified and, simultaneously, it is easy to design the drive circuit. Thus, the number of parts of the drive circuit is reduced. The insulated gate-controlled SI thyristor is low in cost, and maintenance of the same is easy. Further, according to the invention, switching can be executed at a high speed by the gate current which is sufficiently low as compared with anode current, and the direct current component of the gate current is interrupted. Accordingly, gate loss is extremely low. The insulated gate-controlled SI thyristor of this invention can be manufactured by small modification of the step of the conventional SI thyristor by addition of the forming step of an auxiliary cathode area or an auxiliary anode area using the standard fabrication process of a conventional MOS transistor. Thus, it is possible to extremely easily manufacture the thyristor.

BRIEF DESCRIPTION OF THE INVENTION

DESCRIPTION OF THE EMBODIMENTS

Various embodiments of the invention will be described with reference to the accompanying drawings. It is to be noted that the same or similar reference numerals are applied to the same or similar parts and elements throughout the drawings, and the description of the same or similar parts and elements will be omitted or simplified.

Figure 4A:
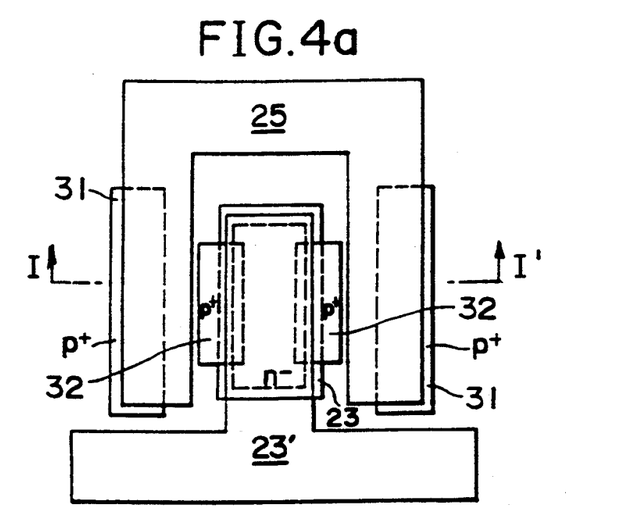
FIGS. 4a and 4b are views showing an embodiment of the invention.
Figure 4B:
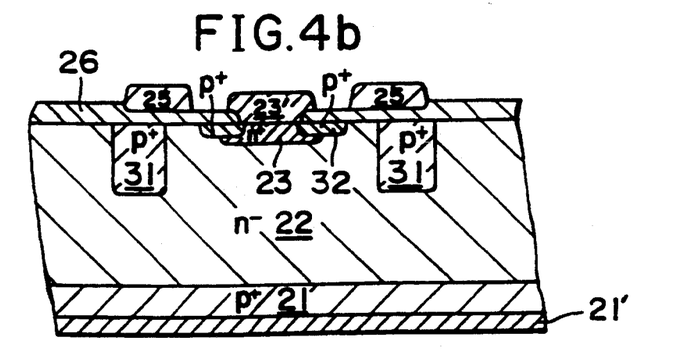

Referring first to FIGS. 4a and 4b, a construction of the invention will be described. FIG. 4a is a top plan view, while FIG. 4b is a cross-sectional view taken along a line I-I' in FIG. 4a. A p+ area 21 is an anode area; an n− area 22, an area forming a channel; an n+ area 23, a cathode area; each of p+ areas 32, an auxiliary cathode area; and each of p+ areas 31, a gate area. The reference numeral 23' denotes a cathode electrode; and 21', an anode electrode. The reference numeral 25 denotes a gate electrode which forms a MOS diode through a gate insulating film 26 located between the gate electrode 25 and the p+ area 31, and which also serves as a gate electrode of an insulated gate transistor in which the p+ area 31 is regarded as a source and the p+ area 32 is regarded as a drain. In FIG. 4b, the construction is such that a P-channel MOSFET of normally-"on" type (depletion type) is connected to a location between a gate and a cathode of an SI thyristor unit. A relationship between impurity concentration of the n− area 22 and a distance between the pair of p+ areas 31 is selected so that the channel is pinched off by depletion layers extending from the p+ areas without applying a voltage to the gate electrode 25. The SI thyristor unit is of normally-off type.

Operation of the construction described above is the same as that described with reference to FIGS. 2a and 2b. When a gate voltage is $V_{off}=0$ Volt, the SI thyristor unit whose gate is the p+ area 31 illustrated in FIGS. 4a and 4b is brought to the blocking state, and the P-channel MOSFET in which the p+ area 31 is a source and the p+ area 32 is a drain is under a conducted state. The gate voltage is changed to $V_{on}$ of a positive value, the potential of the p+ area 31 is raised by capacitive coupling. A potential barrier height against electrons formed at a cathode end of the n− channel 22 is lowered. Thus, the electrons are injected from the n+ cathode area 23. The injected electrons are accumulated at a location adjacent to an interface between the n− channel 22 and the p+ anode area 21. The potential barrier against the holes at an anode end of the n− channel 22 is lowered and vanished. Hole injection from the anode occurs. The holes further promote injection of the electrons from the cathode. Thus, the SI thyristor unit is turned on. At this time, the P-channel MOSFET is brought to an cut-off state. When $V_{off}$ is applied to the gate electrode, the P-channel MOSFET is brought to the conducted state. The holes are drawn toward the cathode through the p+ areas 31. The potential barrier against the electrons at the front face of the cathode rises so that the SI thyristor unit is turned off.

Figure 5A:
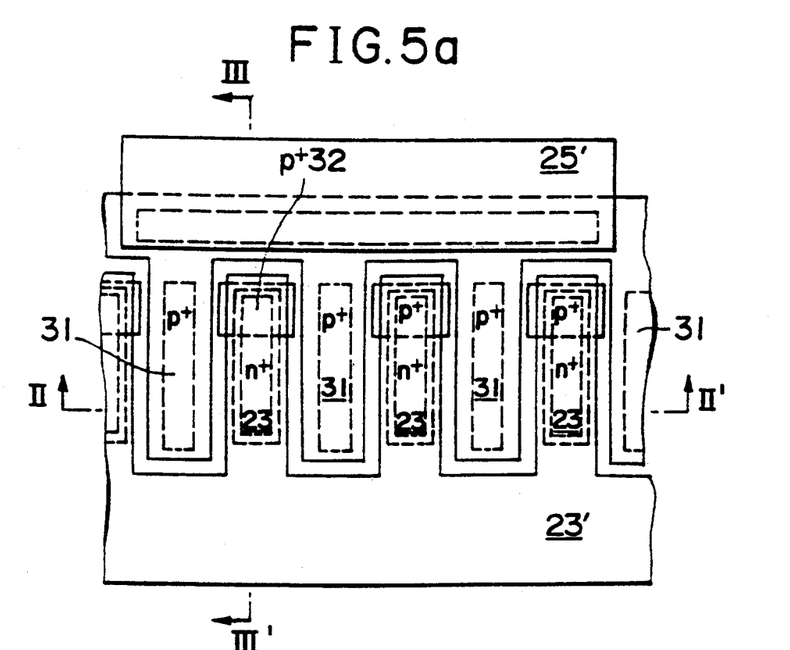
FIGS. 5a, 5b and 5c are views showing an embodiment of the invention.
Figure 5B:
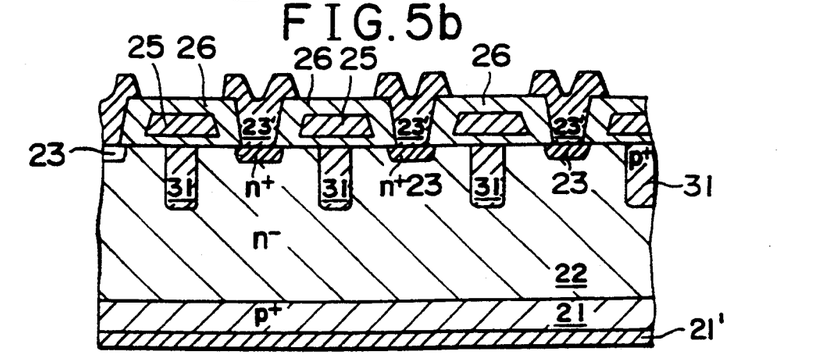
Figure 5C:
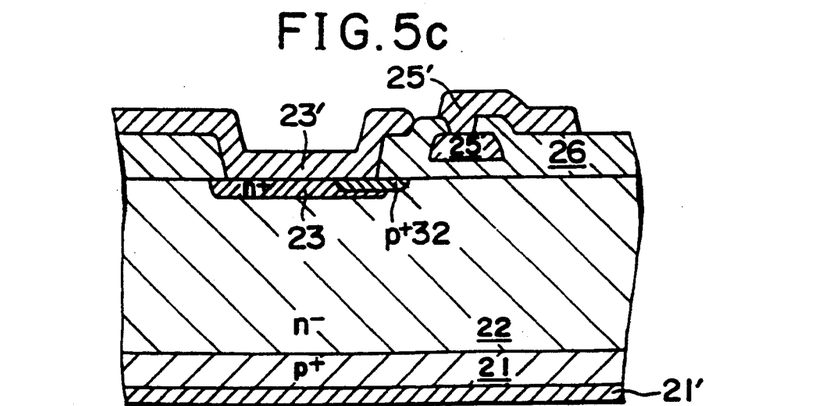

It is needless to say that the structure of the invention is not limited to that illustrated in FIGS. 4a and 4b. FIGS. 4a and 4b show only one unit, that is, one channel surrounded by the pair of gate areas 31. It is needless to say, however, that, for large current, the above-described structure of the invention should be a multi-channel structure in which a plurality of units are connected in parallel to each other, or a structure in which the gate electrode stripes and the cathode electrode stripes are assembled together in an inter-digital fashion. FIGS. 5a, 5b and 5c show an example of the inter-digital arrangement. Similarly to FIGS. 4a and 4b, the reference numeral 23' denotes a cathode electrode, while the reference numeral 25 denotes a gate electrode. FIG. 5a is a top plan view, FIG. 5b is a cross-sectional view taken along a line II-II' in FIG. 5a, and FIG. 5c is a cross-sectional view taken along a line III-III' FIG. 5a. The arrangement of a p+ area 32 or the auxiliary cathode area is different from that illustrated in FIGS. 4a and 4b, but is formed in contact with the end of an n+ cathode stripe 23 along the longitudinal direction of the cathode stripe, that is, along the III-III' direction. In FIGS. 5a, 5b and 5c, similarly to FIGS. 4a and 4b, a P-channel insulating gate transistor is formed in which p+ gate area 31 is regarded as a source area, the auxiliary cathode area 32 is regarded as a drain area, and the electrode 25 is regarded as a gate electrode. In FIGS. 4a and 4b, since the auxiliary cathode areas 32 are formed on both edges of the cathode area 23, there is a disadvantage that a critical mask alignment is required. In the example illustrated in FIGS. 5a, 5b and 5c, however, since the auxiliary cathode areas 32 are formed respectively along the longitudinal direction of the cathode stripes 23, no more critical photolithographic alignments than the conventional junction gate SI-thyristor are required. Thus, manufacturing is easy, and device yield is very high. A p+ area 21 is an anode area, while 21' is an anode electrode. The reference numeral 25' denotes a bonding pad portion for taking out a gate lead wire, and should be formed by a metal such as Al or the like. The gate electrodes 25 should be polycrystal silicon or a high-melting-point metal such as W, Mo, Ti, Ta, Nb or the like, or silicide such as $WSi_2$, $MoSi_2$, or the like. Alternatively, the gate electrodes 25 may be a compound film in which silicide is formed on a substrate of a polycrystal silicon. The impurity concentration in the n− area should be $10^{12} \sim 10^{14}$ cm$^{-3}$, the impurity concentration in the p+ areas 21, 31 and 32 should be $10^{18} \sim 10^{20}$ cm$^{-3}$, and the impurity concentration in the n+ area should be $10^{18} \sim 10^{21}$ cm$^{-3}$. In this case if each of spaces between the p+ gate stripes 31 is equal to or less than 6 μm, the construction becomes a normally-off SI thyristor. If a diffusion width of the each of cathode n+ stripes 23 is 2 μm, a diffusion width of the auxiliary cathode stripe 32 is 1 μm, and a width of an overlapped portion between each of the n+ cathode stripes 23 and the corresponding one of the auxiliary cathode stripes 32 is 0.5 μm, for the construction illustrated in FIG. 4b, the insulating gate-transistor connected to a location between the p+ gate area 31 and the auxiliary cathode area becomes a MOSSIT having a channel length of 1.5 μm. The MOSSIT is preferable because on-resistance $R_{ON}$ of the MOSSIT is smaller than one of the MOSFET. In the structure illustrated in FIG. 5c, the diffusion width of the auxiliary cathode stripe is 3 μm, and the channel length of the MOSSIT is 1.5 μm. In this case, the width of the overlapped portion between the auxiliary cathode stripe and the cathode stripe should be selected or chosen as occasion demands. For example, the width of the overlapped portion could be 10 μm. Gate current $I_{Goff}$ flows to the insulated gate transistor between the gate and the cathode at turning-off of the SI thyristor unit. If, however, the on-resistance $R_{ON}$ of the insulated gate transistor is high, a voltage drop of $I_{Goff}$ due to $R_{on}$ increases larger than the gate potential $V_{GK(on)}$ of the SI thyristor unit under the on-state, so that the SI thyristor unit is not above to turn off. Accordingly, it is necessary that $R_{on}$ becomes sufficiently small so that the $R_{on}$ is brought to the following equation:

$$R_{on} < V_{GK(on)}/V_{Goff}$$

If $R_{on}$ is large, the maximum value $I_{Goff(max)}$ of the gate current, flowing at turn-off is decreased, and time required for turning-off is lengthened. This is not preferable.

Figure 6A:
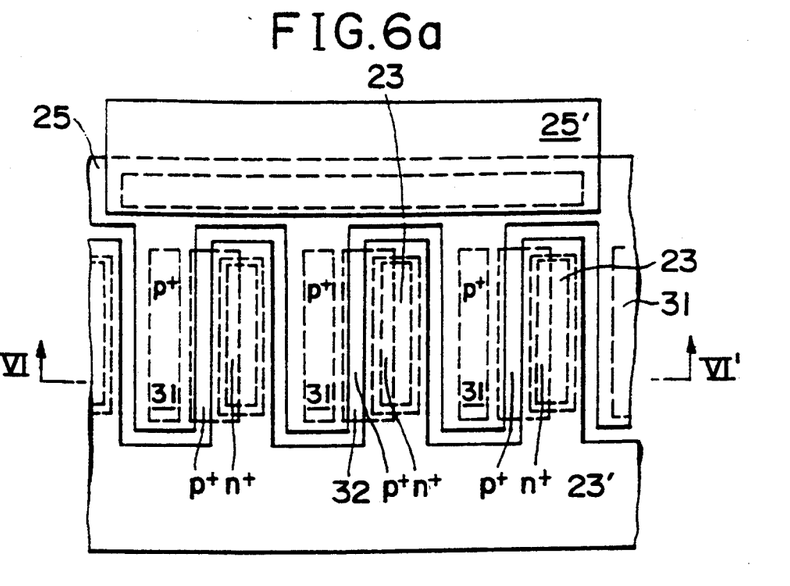
FIGS. 6a and 6b are views showing an embodiment which has an SI anode short-circuiting construction.
Figure 6B:
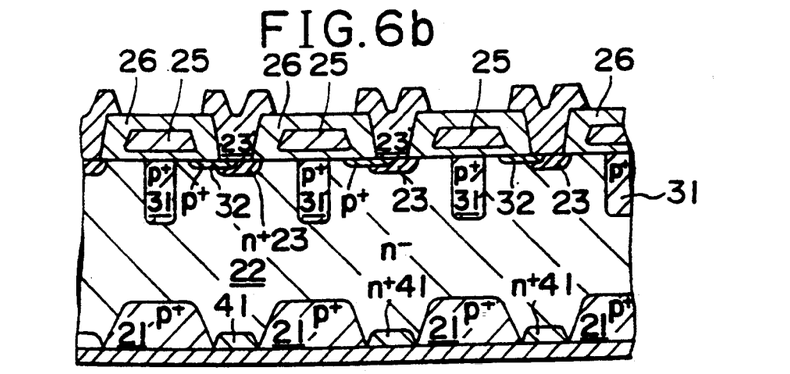

In order to further reduce the on-resistance $R_{on}$ of the MOSSIT, by the structure illustrated in FIGS. 6a and 6b, the channel length should be reduced, and the channel width should be increased. In FIGS. 6a and 6b, the MOSSIT having the channel length of 0.5 μm, under a condition that the gate spacing of the SI thyristor unit is 6 μm, the diffusion width of the cathode n+ stripe is 2 μm, the width of the auxiliary cathode stripe 32 is 2 μm, and the spacing between the p+ stripe 31 and the auxiliary cathode stripe 32 is 0.5 μm, is connected to a location between the gate and the cathode. FIG. 6a is a top plan view, while FIG. 6b is a cross-sectional view taken along a line VI-VI' in FIG. 6a. In FIGS. 6a and 6b, an SI anode short-circuiting structure is adopted in which the p+ anode area 21 is divided into sections, and each of the n+ short-circuiting areas 41 is inserted between a corresponding pair of the sections 21. Electrons are swept away to the n+ short-circuiting areas 41 by the potential between the p+ anode and the n+ short-circuiting areas, whereby tail current at turning-off of the SI thyristor unit is reduced so that further high-speed switching is made possible. A pitch of the p+ anode is selected as a value equal to or less than 2 times of the diffusion length of the electrons.

Figure 7:
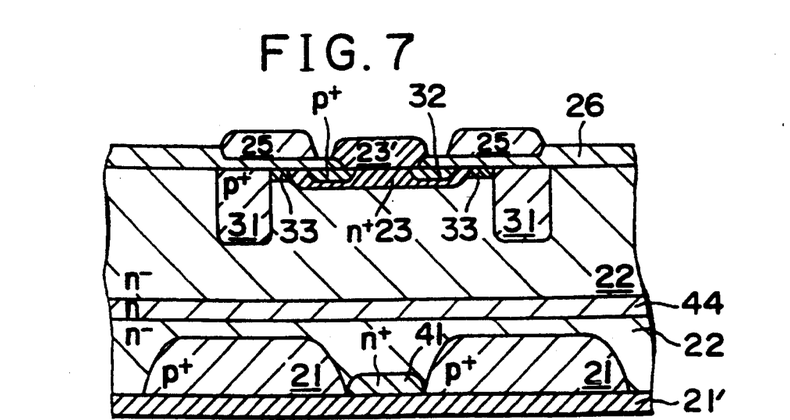
FIG. 7 is a view showing an embodiment in which an N-buffer is used.

FIG. 7 shows an example in which a pair of auxiliary cathode areas 32 are formed inside a cathode area 23. The reference numeral 33 denotes a p− layer or an i-layer, which is completely depleted. The carrier concentration in the area 33 may be same as the concentration in the n− layer 22, if the concentration in the n− layer 22 is low enough. The construction is such that an intrinsic gate point of the MOSSIT is formed at a portion of the cathode area 23 between the p+ area 32 and the area 33, and a potential barrier at the intrinsic gate point is controlled by the potential of a gate electrode 25. In FIG. 7, each of the p+ areas 32 is the source area of the MOSSIT, while the p+ area 31 is a drain area. As compared with the structure illustrated in FIGS. 4a and 4b, it is possible to increase an area of the cathode area. Accordingly, it is possible to cause large current to flow. In FIG. 7, an SI anode short-circuiting structure is adopted similarly to FIGS. 6a and 6b. However, an N-buffer layer 44 is further formed in the vicinity of the anode area. The N-buffer layer 44 has impurity concentration of $1 \times 10^{15} \sim 1 \times 10^{17}$ cm$^{-3}$, while each of a pair of n− areas 22 has an extremely low impurity concentration of $10^{11} \sim 10^{13}$ cm$^{-3}$, whereby a field strength between the gate and the anode is uniform, and the depletion layer from the gate is so arranged as not to reach the anode. Accordingly, the maximum forward blocking voltage can be increased, the switching speed is high, and the voltage drop at conduction can also be decreased. If the maximum forward blocking voltage is the same as with no N-buffer layer 44, the thickness of each of the n− areas 22 should be half so that, naturally, the forward voltage drop is small, and the switching speed is high.

Figure 8A:
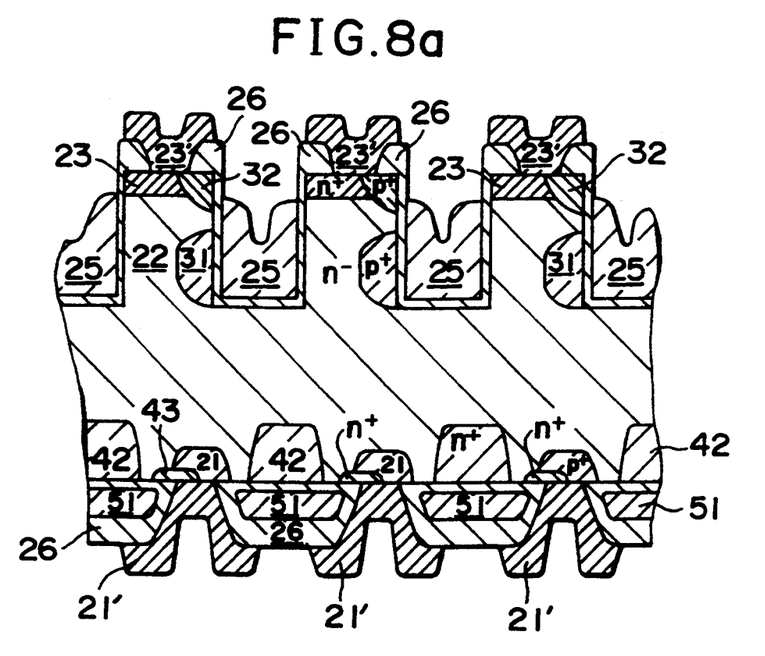
FIG. 8a is a view showing a double-gate SI thyristor in which a first gate is a recessed gate construction.
Figure 8B:
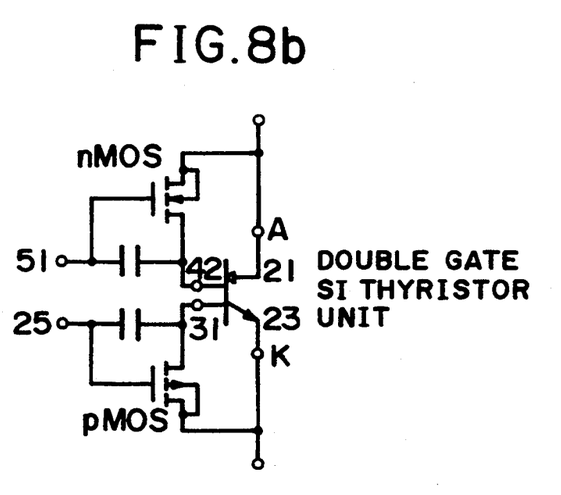
FIG. 8b is a view showing display of the equivalent circuit of the above double-gate SI thyristor.

FIGS. 8a and 8b show an example of an SI thyristor which has a recessed gate structure. Specifically, FIGS. 8a and 8b show an embodiment of a double gate SI thyristor in which a first gate is a recessed gate structure, while a second gate is a surface gate structure. The arrangement illustrated in FIG. 8a is the same as that illustrated in FIGS. 4a through 7 in that each of n+ areas 23 is a cathode area, each of p+ areas 32 is the auxiliary cathode area, and each of p+ areas 21 is the anode area. However, each of p+ areas 31 is a first gate area, each of n+ areas 42 is a second gate area, an electrode 25 formed in cut-into recesses is the first gate electrode, the reference numeral 51 denotes a second gate electrode, and each of n+ areas 43 is an auxiliary anode area. In FIG. 8b, an equivalent circuit is expressed by a P-channel insulated gate transistor formed between the cathode and the first gate, in which the p+ area 31 is regarded as a source area, the p+ area 32 as a drain area, and the N-channel insulated gate transistor formed between the second gate and the anode, in which the n+ area 42 is regarded as a source area, and the n+ area 43 as a drain area. The impurity concentration of the n− area 22 and the width of the cut-into projection are so selected that the n− area 22 of the cut-into projection is completely depleted by the depletion layer extending from p+ area 31 without applying voltage to the first gate electrode 25. The turning-on of the double gate SI thyristor illustrated in FIGS. 8a and 8b is executed as follows. That is, when a positive potential is given to the first gate electrode 25, an N-channel is formed on the surface of n− area 22 which is in contact with an insulating film 26 on the side wall of the recess, which is located just laterally below the first gate electrode. Then a potential barrier at the front surface of the cathode area 23 is reduced. Simultaneously with injection of electrons from the cathode, a negative potential is given to the second gate electrode. In the capacitive coupling, the potential barrier is reduced with respect to the holes in the front surface of the anode. Hence, the holes are injected from the anode. Next, the turning-off is executed by applying zero potential to both the first gate electrode and the second gate electrode. In this case, the P-channel insulated gate transistor adjacent to the first gate is turned on, and the holes are pulled out through the first gate area 31. Simultaneously the N-channel insulated gate transistor adjacent to the second gate is turned on, extracting electrons through the second gate area 42. By doing so, the potential barriers at the front face of the cathode and at the front surface of the anode are raised. In contrast with the single-gate SI thyristor, there is no tail current due to the remaining electrons, and switching at a high speed equal to or less than submicro-second is easily executed. It is of course possible that a single-gate SI thyristor of recessed gate type without the second gate in FIGS. 8a and 8b could also be fabricated. Conversely, it is also possible to omit a structure of the first gate so that the thyristor is driven only by the second gate. Further, it is possible to bring the first gate to a surface gate structure, and the second gate to a recessed gate structure. It is of course possible that both the first and second gates are brought to a recessed gate structure. Furthermore, the structure can be constructed such that only one of the First gate or the second gate is controlled by insulated gate structure while the other is driven by a normal junction gate.

Figure 9:
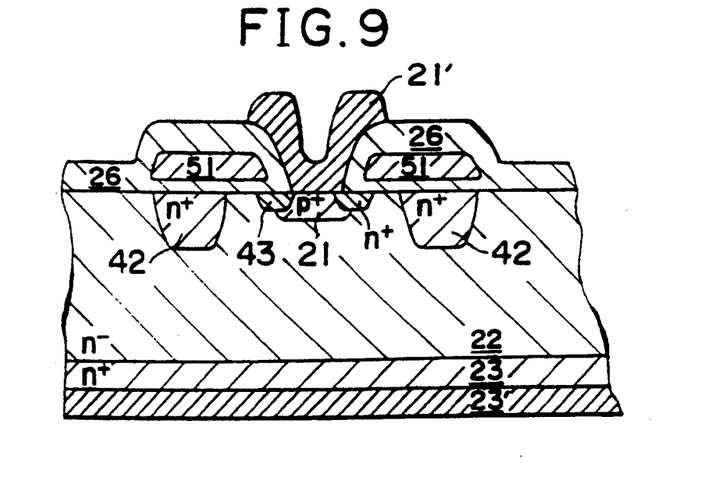
FIG. 9 is a view showing an embodiment of an SI thyristor of inverted operation which is driven by a second gate.

FIG. 9 shows an insulated gate-controlled single-gate SI thyristor which is driven only by the second gate and is also possible to consider as the SI thyristor of inverted operation, having an anode on the top. If this SI thyristor is combined with an SI thyristor of normal operation having a cathode on the top, a complementary-type arrangement is produced which can also be used as a bidirectional switch. In FIG. 9, a p+ area 21 is an anode area, an n+ area 23 is a cathode area, and each of n+ areas 42 is a gate area. Each of n+ areas 43 is an auxiliary anode area or drain area and the n+ areas 42 are source areas of an N-channel insulated gate transistor. Operation is such that the SI thyristor unit is turned on and off by controlling of a potential barrier formed at the front face of the p+ anode area. Specifically, a negative potential is applied to the gate electrode 51. The potential barrier at the anode end of the n− channel 22 is reduced in capacitive coupling. Holes are injected from the p+ anode area. The holes are accumulated at a location adjacent to an interface between an n− channel 22 and the n+ area 23. Electrons are injected from the n+ cathode area 23, and these injected electrons further reduce the potential barrier height at the anode end of the n− channel 22. Thus, the SI thyristor unit in inverted operation is turned on. Turning-off of the SI thyristor unit is executed by turning on the N-channel insulated gate transistor, bringing the gate electrode to 0 (zero) volt. Hence the potential barrier height at the front surface of the p+ anode area is raised, drawing out or extracting the electrons through each of the n+ areas 42.

Figure 10A:
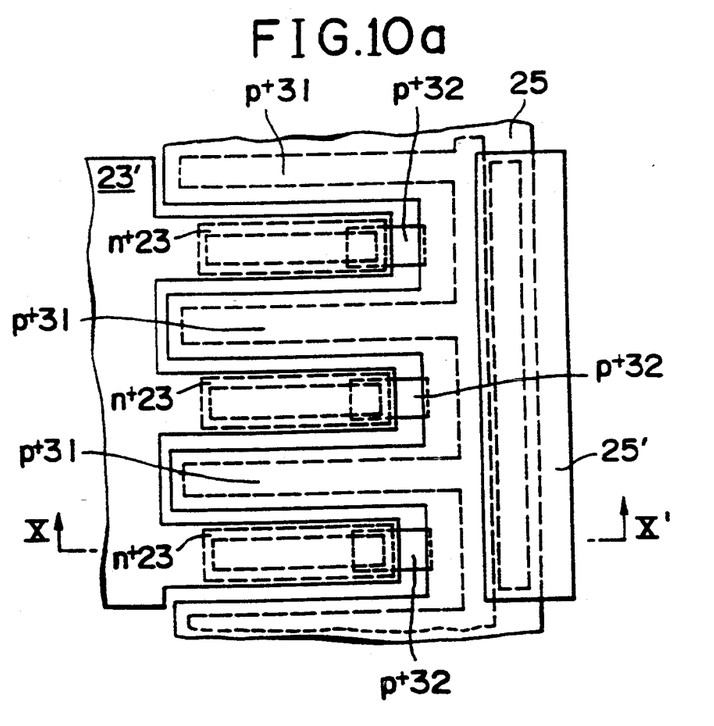
FIGS. 10a and 10b are views showing a still another embodiment of the invention.
Figure 10B:
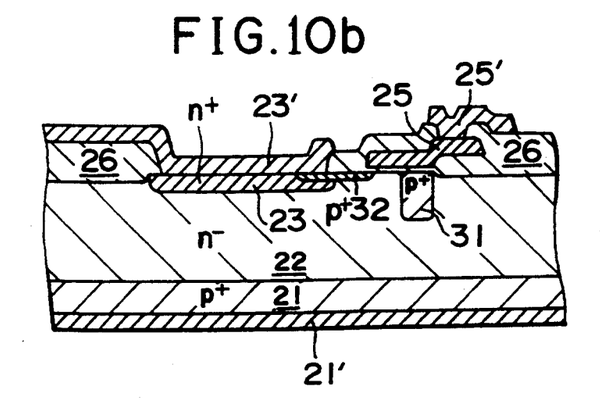

FIGS. 10a and 10b show a still another embodiment of the invention, which improves the disadvantages such that the critical mask alignment is required in FIGS. 4a and 4b. Specifically, the embodiment illustrated in FIG. 4b has the following problems. Since fine dimensions are required in order to form the P-channel MOS transistor at the closely spaced location between the n+ cathode gate stripe 23 and the p+ stripe 31, it is impossible to increase the widths of the p+ stripe 32 or the n+ cathode stripe 23, and large anode current cannot flow. Further, there is a problem that leak current between each of the p+ gate stripe 31 and the n+ stripe 23 is apt to flow. Moreover, there is also a problem that, once the spacing between the n+ stripe 23 and each of the p+ stripes 31 is determined, the degrees of freedom of the design for the P-channel MOS transistor is restricted. The structure illustrated in FIGS. 10a and 10b solves these problems. FIG. 10a is a top plan view, and FIG. 10b is a cross-sectional view taken along a line X-X' in FIG. 10a, showing a multi-channel structure. Although not shown, a cross-sectional view in FIG. 10a is entirely the same as that in FIG. 5b. The structure is such that current between a cathode and an anode is controlled by a potential barrier due to p+ gate areas 31 which put therebetween the n+ cathode area. In FIGS. 10a and 10b, each P-channel MOS transistors is connected to each SI thyristor unit in a longitudinal direction of the cathode stripe, respectively. It is possible to consider that the arrangement illustrated in FIGS. 10a and 10b has a structure which further improves the structure illustrated in FIGS. 5a, 5b and 5c. Although the p+ gate areas in FIGS. 5a, 5b and 5c are separated from each other in every unit, the p+ gate areas in FIGS. 10a and 10b are all formed continuous and are integrated with each other. In FIGS. 10a and 10b, a MOS transistor is formed with a plurality of p+ auxiliary cathode areas 32 each serving as a drain area, a plurality of p+ gate areas 31 each serving as a source area, and the reference numeral 25 serving as a gate electrode. Dissimilarly to the structure illustrated in FIGS. 4a and 4b and FIGS. 5a, 5b and 5c, a spacing between the p+ area 32 and the p+ area 31 in a direction parallel to the long side of the cathode stripe 23, which corresponds to the gate length of the P-channel MOS transistor in FIGS. 10a and 10b can freely be selected regardless of the structure, arrangement and dimension of the thyristor. Accordingly, the degree of freedom of design of the P-channel MOS transistor is large. Further, by the fact that the P-channel MOS transistor is not required to occupy large area between the gate and the cathode stripe along the longitudinal direction X-X', it is unnecessary to reduce the width of the cathode stripe, and it is easy to largely increase the anode current of SI thyristor unit. Further, since the relatively large plane dimension is afforded which is substantially the same order as the conventional surface-gate SI thyristor, manufacturing is easy.

Figure 11:
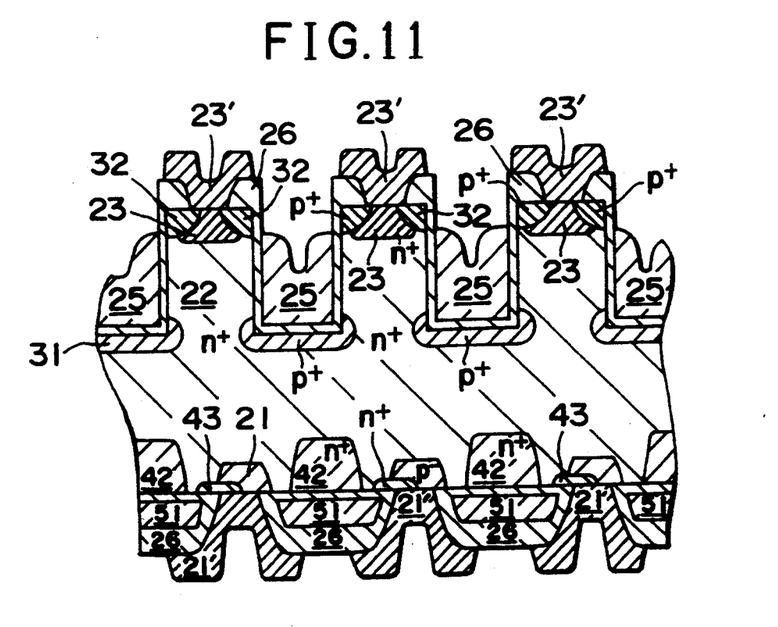
FIG. 11 is a view showing a double-gate SI thyristor in which a first gate is a recessed gate construction.

FIG. 11 shows a still further embodiment of the invention, which is an example of a double-gate SI thyristor in which a first gate is a recessed gate, while a second gate is a surface gate. Similarly to the arrangement illustrated in FIGS. 8a and 8b, each of p+ areas 31 is a first gate area, each of n+ areas 42 is a second gate area, each of n+ areas 23 is a cathode area, each of p+ areas 32 is an auxiliary cathode area, each of p+ areas 21 is an anode area, and each of n+ areas 43 is an auxiliary anode area. Although, in FIGS. 8a and 8b, the P-channel MOS transistor is formed which has the gate electrode 25 on one side of the projection on which the cathode is formed, P-channel MOS transistors in FIG. 11 are formed respectively on both sides of a projection, and an on-resistance is reduced as compared with the ease of FIGS. 8a and 8b. Since the p+ areas 31 are formed on the entire bottom surface of the recessed portion, manufacturing is easy as compared with a ease where the P-channel MOS transistor is formed on the side wall of the groove as shown in FIGS. 8a and 8b. A potential barrier against the electrons which are injected from the cathode is formed at a location adjacent to the central portion of n− channel 22 which is put between the first gate areas 31. A positive potential is applied to the first gate electrode 25, whereby the height of the potential barrier is reduced by capacitive coupling through a gate insulating film 26. Simultaneously, a negative potential is applied to a second gate electrode 51. The height of the potential barrier against holes from the anode is reduced, to turn on the double-gate SI thyristor unit. Turning-off of the SI thyristor unit is executed as follows. That is, the gate voltage of the P-channel MOS transistor formed between the cathode and the first gate and the gate voltage of the N-channel MOS transistor formed between the anode and the second gate are brought to zero, whereby the MOS transistors are turned off. The holes are extracted from the first gate, and the electrons are extracted from the second gate, thereby raising the potential of each of the potential barriers. It is of course that the construction illustrated in FIG. 11 may become a construction similar to FIG. 7 in which the p+ auxiliary cathode area 32 is contained within the n+ cathode area 23. As has been described with reference to FIGS. 8a and 8b, it is of course that the construction adjacent to the first gate of the present embodiment can be applied to a recessed gate type single-gate SI thyristor in which the structure adjacent to the second gate is omitted. In this case, the structure adjacent to the anode may become to the anode short-circuiting construction illustrated in FIGS. 6a and 6b, or to the N-buffer construction illustrated in FIG. 7. Moreover, similarly to that described with reference to FIGS. 8a and 8b, various modifications that the first gate becomes the junction gate structure, the second gate is the recessed insulated gate type, and the like can be executed within the scope of the gist of the present invention. Although a cut-off groove having a vertical side wall is illustrated in FIGS. 8a and 8b and FIG. 1i, the groove may be a cut-into groove of V-type and a cut-into groove of inverted mesa type.

Figure 12A:
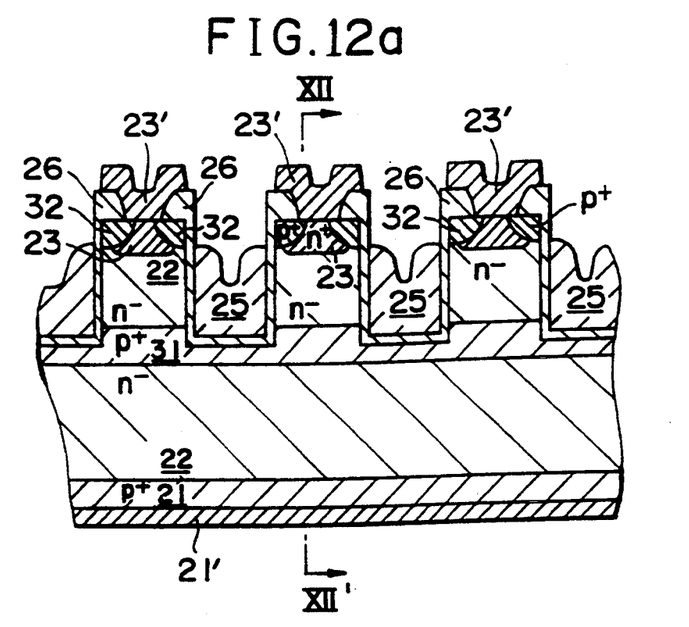
FIGS. 12a and 12b are views showing a buried gate SI thyristor.
Figure 12B:
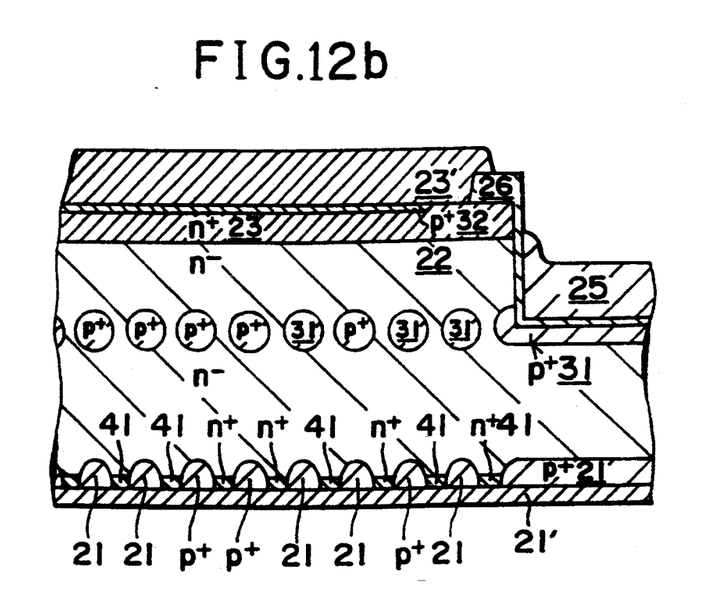
Figure 13A:
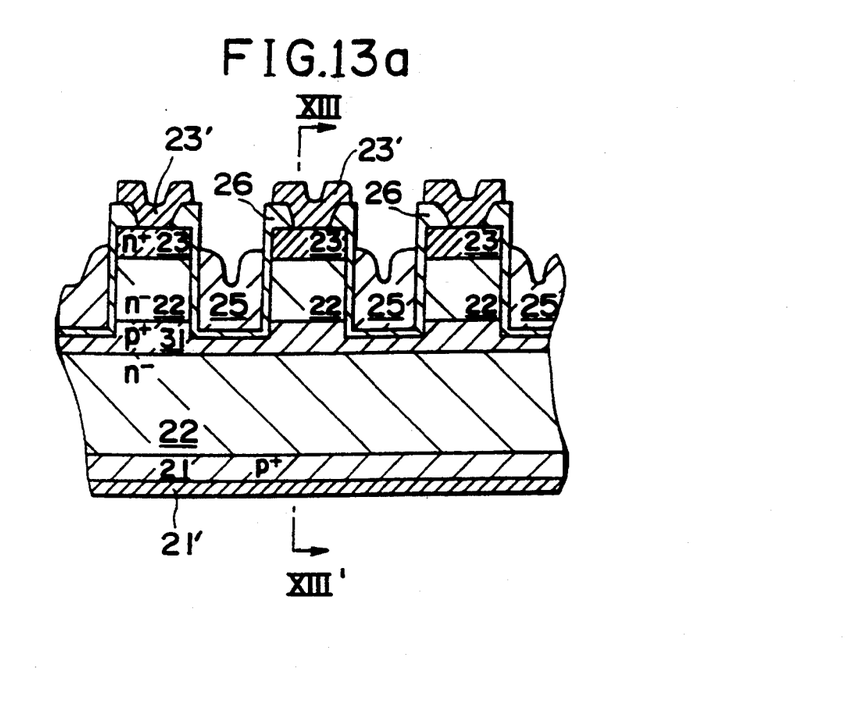
FIGS. 13a and 13b are views showing a buried gate SI thyristor.
Figure 13B:
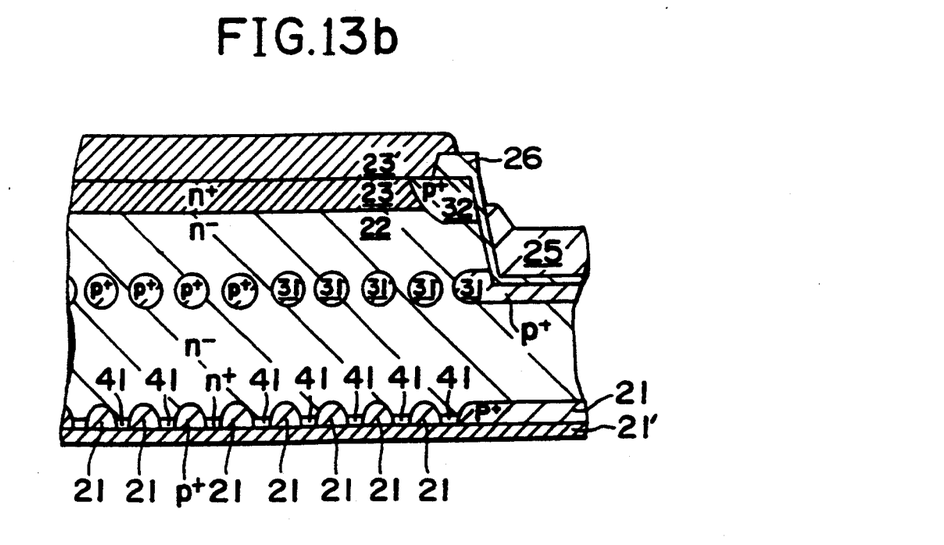

FIGS. 12a and 12b and FIGS. 13a and 13b show an embodiment in which the invention is applied to a burled gate SI thyristor. FIGS. 12b and 13b are cross-sectional views taken respectively along lines XII–XII' in FIGS. 12a and 13a. In the cross-sectional views in FIGS. 12b and 13b, each of p+ gate areas 31 is divided to a multi-channel construction. As viewed in plan, however, the p+ gate areas 31 are continuous to each other and are integrated with each other. Turning-on the SI thyristor is executed such that the potential barrier against the electrons at the central portion of each channel is reduced by the fact that the positive potential is applied to the gate electrode 25 of the MOS diode which is formed by the oxidation film 26 on the bottom of the cut-into groove, the p+ gate area 31 and the gate electrode 25. It is required for high-speed turning-on that the capacity of the MOS diode at the bottom of the cut-into groove is sufficiently increased more than the p+ gate capacitance of the SI thyristor unit. In case of the buried gate structure, the junction capacitance of the gate is relatively large. Accordingly, it is desirable that the thickness of the oxide film at the bottom of the groove is equal to or less than 100 Å. Turning-off of the SI thyristor unit is executed as follows. When the applied voltage on the gate electrode 25 of the depletion-type P-channel MOS transistor, in which the p+ auxiliary cathode area 32 adjacent to the n+ cathode area 23 is regarded as a drain, and the p+ gate area 31 is regarded as a source, is zeroed, the holes are extracted from the p+ gate area. FIG. 12b and FIG. 13b show an SI anode short-circuiting structure in which the p+ anode area 21 is divided into sections, and the n+ area 41 is inserted into a location between the sections. In case where the turning-off time could be slow, however, the construction may be a uniform anode construction in which the n+ area 41 is omitted. If the tail current at turning-off raises a problem, the construction should be a double gate structure. As compared with the arrangement in FIGS. 12a and 12b, the construction illustrated in FIGS. 13a and 13b has wide space at the periphery of the cathode area and no finely patterned structures are required. Thus, manufacturing is easy and device yield is very high.

What is claimed is:

1. A static induction thyristor comprising:
 a first semiconductor area having a high impurity concentration of a first conductivity type;
 a second semiconductor area having a low impurity concentration lower than the high impurity concentration in said first semiconductor area, formed adjacent to said first semiconductor area;
 a third semiconductor area having a high impurity concentration of a second conductivity type which is of conductivity type opposite to said first conductivity type, said third semiconductor area being formed on a first part of a surface of said second semiconductor area;

a fourth semiconductor area of the first conductivity type formed on a second part of the surface of said second semiconductor area so that at least a portion of said fourth semiconductor area is located at at least one of an area at least partially within said third semiconductor area and an area adjacent to said third semiconductor area;

a plurality of fifth semiconductor areas having a high impurity concentration of the first conductivity type, formed on a third part of the surface of said second semiconductor area and separated from said fourth semiconductor area, each of said fifth semiconductor areas being separated from any other of said fifth semiconductor areas in said second semiconductor area;

an insulating film so formed as to cover at least a portion of a surface of at least one of said plurality of fifth semiconductor areas and at least a portion of the surface of said second semiconductor area, said insulating film also being located between said fourth semiconductor area and at least one of said plurality of fifth semiconductor areas; and an insulated-gate control electrode formed on said insulating film.

2. A static induction thyristor according to claim 1, wherein said first semiconductor area is divided into a plurality of sections, wherein short-circuiting areas having high impurity concentration of said second conductivity type are formed between said divided sections of said first semiconductor area.

3. A static induction thyristor according to claim 1, wherein at least one of said fifth semiconductor area is formed on a part of a wall of a recess formed in the surface of said second semiconductor area, and wherein at least a part of said insulated-gate control electrode is formed within said recess.

4. A static induction thyristor according to claim 1, wherein said second semiconductor area has at least one recessed portion, and wherein at least one of said fifth semiconductor areas is formed within said recessed portion.

5. A static induction thyristor according to claim 2, wherein a buffer layer of said second conductivity type is provided at a location adjacent to said first main electrode area.

6. A static induction thyristor according to claim 3, wherein said first semiconductor area is divided into a plurality of sections, wherein short-circuiting areas having high impurity concentration of said second conductivity type are formed between said divided sections of said first semiconductor area.

7. A static induction thyristor according to claim 4, wherein said first semiconductor area is divided into a plurality of sections, wherein short-circuiting areas having high impurity concentration of said second conductivity type are formed between said divided sections of said first semiconductor area.

8. A static induction thyristor according to claim 4, wherein a recess is formed in the surface of said second semiconductor area, and wherein at least a part of said insulated-gate control electrode is formed within said recess.

9. A static induction thyristor according to claim 4, wherein a recess is formed in the surface of said second semiconductor area, and wherein at least a part of said insulated-gate control electrode is formed within said recess.

10. A static induction thyristor according to claim 6, wherein a buffer layer of said second conductivity type is provided at a location adjacent to said first main electrode area.

11. A static induction thyristor according to claim 7, wherein a buffer layer of said second conductivity type is provided at a location adjacent to said first main electrode area.

12. A static induction thyristor according to claim 8, wherein said first semiconductor area is divided into a plurality of sections, wherein short-circuiting areas having high impurity concentration of said second conductivity type are formed between said divided sections of said first semiconductor area.

13. A static induction thyristor according to claim 9, wherein said first semiconductor area is divided into a plurality of sections, wherein short-circuiting areas having high impurity concentration of said second conductivity type are formed between said divided sections of said first semiconductor area.

14. A static induction thyristor according to claim 12, wherein a buffer layer of said second conductivity type is provided at a location adjacent to said first main electrode area.

15. A static induction thyristor according to claim 13, wherein a buffer layer of said second conductivity type is provided at a location adjacent to said first main electrode area.

16. A static induction thyristor comprising:

a first semiconductor area of a first conductivity type having a high impurity concentration;

a second semiconductor area having a low impurity concentration lower than the high impurity concentration in said first semiconductor area, formed adjacent to said first semiconductor area;

a third semiconductor area of a second conductivity type having a high impurity concentration, formed on a first surface of said second semiconductor area;

a fourth semiconductor area of the second conductivity type formed on a part of a second surface of said second semiconductor area so that at least a portion of said fourth semiconductor area is located at at least one of an area at least partially within said first semiconductor area and an area adjacent to said first semiconductor area;

a plurality of fifth semiconductor areas of the second conductivity type having high impurity concentration, formed on a second part of said second surface of said second semiconductor area in spaced relation to said fourth semiconductor areas each of said fifth semiconductor areas being separated from any other fifth semiconductor area in said second semiconductor area;

an insulating film so formed as to cover at least a portion of a surface of at least one of said plurality of fifth semiconductor areas and at least a portion of said second surface of said second semiconductor area between said fourth semiconductor area and at least one of said plurality of fifth semiconductor areas; and an insulated-gate control electrode formed on said insulating film.

17. A static induction thyristor according to claim 16, wherein said first semiconductor area is divided into a plurality of sections, wherein short-circuiting areas having high impurity concentration of said second conductivity type are formed between said divided sections of said first semiconductor area.

18. A static induction thyristor according to claim 16, wherein said fifth semiconductor area is formed on a part of a wall of a recess formed in said second surface of said second semiconductor area, and wherein at least a part of said insulated-gate control electrode is formed within said recess.

19. A static induction thyristor according to claim 17, wherein a buffer layer of said second conductivity type is provided at a location adjacent to said first main electrode area.

20. A static induction thyristor according to claim 18, wherein said first semiconductor area is divided into a plurality of sections, wherein short-circuiting areas having high impurity concentration of said second conductivity type are formed between said divided sections of said first semiconductor area.

21. A static induction thyristor according to claim 20, wherein a buffer layer of said second conductivity type is provided at a location adjacent to said first main electrode area.

22. A static induction thyristor comprising a double-gate thyristor which comprises:
a semiconductor substrate having a low impurity concentration, an anode area of a first conductivity type formed on a first portion of a first main surface of said semiconductor substrate, an auxiliary anode area of a second conductivity type formed at at least one of a location within said anode area and a location adjacent to said anode area, a first gate area of a second conductivity type, said first gate area having a surface formed on a part of the first main surface of said semiconductor substrate at a location adjacent to said anode area in spaced relation to said auxiliary anode area, and an insulating film, on which a first gate electrode is formed, on an upper portion of the surface of said first gate area and an upper part of a second portion of the first main surface of said semiconductor substrate between said auxiliary anode area and said first gate area; and
a cathode area of said second conductivity type formed on a first part of a second main surface opposed against the first main surface of said semiconductor substrate, an auxiliary cathode area of said first conductivity type formed at one of a location within said cathode area and a location adjacent to said cathode area, a second gate area of first conductivity type formed on a second part of the second main surface of said semiconductor substrate at a location adjacent to said cathode area in spaced relation to said auxiliary cathode area, and an insulating film on which a second gate electrode is formed at an upper portion of a surface of said second gate area and at an upper portion of said second main surface of said semiconductor substrate put between said auxiliary cathode area and said second gate area.

23. A static induction thyristor according to claim 22, wherein said second gate area is formed on a part of a wall of a recess formed in said second main surface of said semiconductor substrate, and wherein at least a part of said second gale electrode is formed within said recess.

* * * * *